United States Patent
Andre et al.

(10) Patent No.: US 7,842,556 B2
(45) Date of Patent: Nov. 30, 2010

(54) METHOD FOR LOW-TEMPERATURE SEALING OF A CAVITY UNDER VACUUM OR UNDER CONTROLLED ATMOSPHERE

(75) Inventors: Bernard Andre, Quaix en Chartreuse (FR); Agnès Arnaud, Saint Jean le Vieux (FR)

(73) Assignee: Commissariat a l'Energie Atomique, Paris (FR)

( * ) Notice: Subject to any disclaimer, the term of this patent is extended or adjusted under 35 U.S.C. 154(b) by 174 days.

(21) Appl. No.: 12/171,530

(22) Filed: Jul. 11, 2008

(65) Prior Publication Data

US 2008/0268580 A1  Oct. 30, 2008

Related U.S. Application Data

(63) Continuation of application No. PCT/FR2007/050697, filed on Jan. 25, 2007.

(30) Foreign Application Priority Data

Feb. 8, 2006  (FR) .................................. 06.50445

(51) Int. Cl.
*H01L 21/50* (2006.01)
*H01L 21/56* (2006.01)
*H01L 21/48* (2006.01)

(52) U.S. Cl. ............................... 438/127; 257/E21.502
(58) Field of Classification Search ................ 438/127; 257/E21.502
See application file for complete search history.

(56) References Cited

U.S. PATENT DOCUMENTS

| 4,853,669 | A | 8/1989 | Guckel et al. | |
|---|---|---|---|---|
| 7,081,623 | B2 * | 7/2006 | Pai et al. | ..................... 250/299 |
| 2004/0248344 | A1 | 12/2004 | Partridge et al. | |
| 2005/0017313 | A1 | 1/2005 | Wan | |
| 2007/0121191 | A1 * | 5/2007 | Pan | ............................ 359/291 |

OTHER PUBLICATIONS

Sze S M: "VLSI Technology Second Edition," Metallization, 1988, McGraw-Hill, Singapore, XP002405624, pp. 386-393.
Brian H. Stark et al., "*A Low-Temperature Thin-Film Electroplated Metal Vacuum Package*," Journal of Microelectromechanical Systems, vol. 13, No. 2, Apr. 2004, pp. 147-157.

\* cited by examiner

*Primary Examiner*—Luan C Thai
(74) *Attorney, Agent, or Firm*—Burr & Brown

(57) ABSTRACT

This method for sealing a cavity of a component placed in the chamber is carried out by physical vapour deposition (PVD) of germanium or silicon.

13 Claims, 2 Drawing Sheets

METHOD FOR LOW-TEMPERATURE SEALING OF A CAVITY UNDER VACUUM OR UNDER CONTROLLED ATMOSPHERE

FIELD OF THE INVENTION

The invention relates to the sealing of micro- or nano-devices under vacuum or under controlled atmosphere, for which it is necessary to maintain part of the system under a partial air vacuum.

BACKGROUND OF THE INVENTION

As stated previously, the invention relates to a vacuum sealing technology which has applications in nano- or micro-devices. It relates in particular to the fields of MEMS (Micro Electro Mechanical Systems), in particular RF micro-resonators for communication systems, requiring a high quality Q factor. Such a Q factor characterizes the frequency selectivity of the filters produced and is therefore directly associated with the performance of the micro-resonators. Under vacuum, friction is eliminated and the Q factor is considerably improved thereby. Moreover, the vacuum prevents any contamination of the micro-resonators, which could cause a slip of the resonance frequency.

The invention also relates to accelerometers, micromechanical DC-DC' converters and field emission devices.

One particularly advantageous field of this application is that of uncooled infrared detectors. In this application, added to the need to seal a cavity under vacuum to improve the thermal insulation of the sensor, is the need to have a seal that is transparent to infrared radiation.

Several cavity sealing methods are known today, particularly standard packaging methods using individual metal or ceramic casings. Despite the possibilities of process automation, the cost of such packagings remain very high and sometimes prohibitive for certain applications.

Growing demand in the MEMS market has led to the development of less costly technologies in which the packaging is executed on the wafer itself, so as to enjoy the benefits of collective treatment.

According to this approach, two main families of methods can be distinguished: wafer bonding methods and thin layer vacuum deposition sealing methods.

In principle, wafer bonding methods consist of placing two wafers in contact and welding them by raising the temperature. These methods are complicated to apply, to execute the weld, and require a temperature rise that may be critical for certain devices and other active components.

The production of increasingly small devices now serves to carry out cavity sealing directly by thin layer deposition. These methods serve to lower the production cost because they only require the addition of a single step in the production process. The prior placement of the deposit under vacuum ensures the removal of the ambient atmosphere from the cavity to be sealed, and the completed deposit plugs the vents, thereby constituting a sealed barrier.

The deposition techniques used in the prior art are based on the principle of chemical vapour deposition (CVD, LPCVD, MOCVD, etc.).

According to these methods, a precursor gas of the deposit to be produced is injected at a pressure of typically between 10 and $10^3$ Pa and decomposes on the substrate to be treated when raised to high temperature, typically >400° C., See, for example, U.S. Pat. No. 4,853,669.

This technique serves to obtain a good conformity of the deposit, that is, the deposit is deposited on the entirety of the part, regardless of the geometry thereof. For differences in level or vent clogging, this is a crucial advantage because the material is deposited on the root and on the sides of the hole to be filled.

However, the drawbacks of CVD and its derivative techniques, reside in the high temperature employed, which is necessary to achieve the decomposition of the precursors on the substrate. This high temperature precludes certain applications in which the thermal budget (i.e., amount) must remain as low as possible (micro-bolometers, applications on integrated circuits, etc.).

Furthermore, the working pressures, which determine the level of vacuum in the cavity, are several decades higher than those used in physical vapour deposition techniques (PVD).

Finally, risks of leaving organic waste in the cavity exist.

An alternative deposition technique is physical vapour deposition (PVD). According to this method, which takes place under partial vacuum, the vapour of the material to be deposited is created by a physical process, that is by heating or sputtering a target.

Contrary to CVD techniques, the vapour is condensed on the subject to be treated, without requiring additional heat input.

However, and in practice, where evaporation is concerned, the large majority of methods include a substrate heating step, in order to densify the deposits and improve the adhesion to the substrate.

Furthermore, it has been observed that PVD methods are not suitable for producing matching deposits, that is, capable of correctly matching the shapes of the substrate. This is because, whether by a process of evaporation or sputtering, the vapour generated has a spatial distribution that can be modelled mathematically by a $\cos(\theta)^n$ law, where $\theta$ is the angle between the atom emission direction and the axis of symmetry of the emitting source (the perpendicular to the target, in the case of a sputtering target), and n is an integer which determines the exact shape of the vapour cloud.

Hence the emission of the vapour is highly directional, thereby significantly affecting the good conformity of the deposit. Accordingly and so far, these techniques, derived from PVD have not been adopted for the described difference in level or hole plugging.

Some teams have nevertheless attempted such methods, but without success.

B. H. Stark and K. Najafi, Journal of Microelectromechanical Systems, Vol. 13, no. 2, April 2004 claim to have provided a low-temperature vacuum seal (T<250° C.). This is in fact a nickel deposit produced by electroplating, providing a seal cover. The final sealing of the hole of the cavity was attempted with several methods, including gold evaporation and sputtering techniques. In the case of PVD techniques, it was necessary to reduce the size of the hole to 0.15 µm because it proved impossible to plug larger (8 µm) holes. This is an important limitation for the preparation of the device, because reducing the size of the vent significantly lengthens the gas removal time.

This document therefore reveals that the plugging of vents by gold evaporation is fruitless. As an alternative strategy for the final sealing of the hole, the authors selected the welding of lead/tin alloy beads.

To try to avoid the directional emission of the vapour in PVD methods and therefore the non-conformity of the vent plugging, one solution for a person skilled in the art could reside in the heating of the substrate. In fact, although the species have a high directivity during the transport phase in the gas state, the thermal activation of the substrate to be treated serves to increase the mobility of the atoms on the surface and possibly to improve the covering capacity of the deposit. However, as already stated, the temperature rise of the substrate is highly unfavourable, and even incompatible with the applications considered by the present invention.

Another alternative which could be tested consists of the use of inclined or directional substrates, in order to compensate for the directivity of the vapour by an adjustment of the angle between the vapour and the device to be treated. However, this involves unconventional equipment, relatively unavailable in industrial circles, and costly.

A clear need therefore exists for a method for sealing by deposit not having the abovementioned drawbacks in comparison with the prior art methods, in particular which can be implemented at low pressure, at low temperature, without an organic or organometallic precursor, and in standardized deposition devices.

SUMMARY OF THE INVENTION

The method of this invention consists in physical vapour deposition (PVD) of germanium (Ge) or of silicon (Si).

This method serves to obtain a sealing, or "packaging", of the active elements in the semiconductor wafer, in a collective manner, thereby significantly lowering the production costs.

Furthermore, this sealing method has the advantage of not causing or not requiring any significant temperature rise.

Advantageously, the method according to the invention has an application in the field of uncooled infrared detectors. In fact, the use of such a method serves to seal a cavity under vacuum to improve the thermal insulation of the sensor, while obtaining a seal that is transparent to infrared radiation.

DETAILED DESCRIPTION OF THE INVENTION

Figure 1:
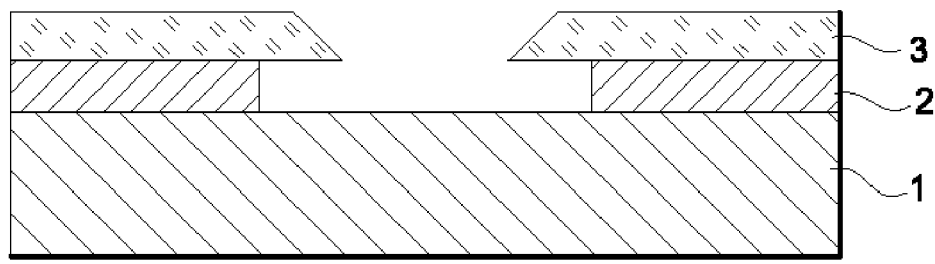
FIG. 1 is a schematic of the test device for vent plugging tests.

Thus the invention relates to a method for sealing a cavity of a sample placed in a chamber, by physical vapour deposition. According to the invention and as an inventive step, the deposition is produced by evaporating germanium (Ge) or silicon (Si).

The physical vapour deposition (PVD) method is well known to a person skilled in the art. It takes place under a rarefied atmosphere (<10 Pa) in three steps: the creation of a vapour by evaporation or sputtering from a source, its transport to a chamber, and its condensation on the surface of the samples to be coated.

The invention therefore consists in having selected the elements Ge or Si to create the vapour via evaporation. This selection is inventive because the prior art demonstrated that this method was not suitable when using Au (2) and it was also demonstrated in the context of the invention that the use of aluminium (Al) or zinc sulphide (ZnS) does not yield satisfactory results (see FIGS. 2, 3 and 4 below).

In practice, germanium (Ge) may be present in the form of pieces of random geometry or wafers. The germanium is placed in a copper crucible for example, or a liner of another material, molybdenum in particular. The germanium can be vaporized by an electron gun or a Joule effect crucible. In the case of an electron gun, the electrons emitted by a filament are accelerated towards the crucible polarized to voltages of several kV, for example 8 kV, and cause the heating of the material and its evaporation. The evaporation conditions of silicon (Si) are similar.

Characteristically, no intentional heating is carried out on the samples to be treated. This is a significant difference from the prior art methods which require thermal activation.

Because of this, the temperature in the chamber remains lower than 100° C., preferably about 20° C. In fact, in the absence of heating, it can be considered that the temperature remains close to ambient temperature, about 20° C. Slight heating is possible in the case in which the chamber has very small dimensions and the crucible-sample distance is short. In all events, the temperature always remains lower than 100° C.

As already stated, for the intended applications, it is crucial to avoid causing a temperature rise during the sealing process. This has the major advantage of being able to treat materials sensitive to high temperatures, such as glasses and polymers in particular. Moreover, the Applicant has demonstrated in the context of this invention that the temperature rise was not sufficient to significantly improve the results of sealing by PVD (see FIG. 3 below).

In terms of pressure, the overall method takes place at low pressure. The pressure in the chamber advantageously varies between $10^{-5}$ Pa and $10^{-1}$ Pa.

Prior to evaporation, the vacuum in the chamber is produced by means of a low-vacuum, then high-vacuum pumping set. The typical vacuum before deposition is lower than $10^{-4}$ Pa.

The pressure during the deposition phase, which corresponds to the maximum pressure in the cavity after sealing, is typically between $10^{-3}$ and $10^{-4}$ Pa, in the absence of degassing of the cavity itself.

It is possible to introduce a gas into the chamber to increase the working pressure. A typical pressure is then $10^{-1}$ Pa.

One considerable advantage of the method according to the invention is that it can be implemented in standard devices for PVD, called standard evaporation PVD rack, for example of the type BALZERS BAK 760.

Furthermore, perfectly satisfactory results have been obtained by placing the sample to be treated in the chamber on a conventional shell type sample-holder. Surprisingly, it has been demonstrated by the Applicant that contrary to the suggestions of the prior art, the use of an inclined sample-holder did not produce satisfactory results in the context of the applications intended by the present invention (see FIGS. 2 and 3 below).

The germanium and silicon used are sufficiently pure to be transparent in the infrared, in particular in the spectral range between 2 and 20 μm. If the method according to the invention is applicable to treat any nano- or micro-device, the transparency of the seal obtained makes it particularly suitable when the sample treated is a micro-bolometer.

As already stated, the method according to the invention serves to produce perfectly suitable seals, pluggings or encapsulations, that is, covering the root and the sides of the holes to be treated, and having the advantage of being transparent.

The invention therefore also relates to a sample having plugged vents or cavities sealed by thin layer deposition of Ge or Si.

Advantageously, such a sample is prepared from glass or polymer, and is a nano- or micro-device, preferably a micro-bolometer.

EXEMPLARY EMBODIMENTS

The clogging of vents by the PVD method was tested on representative devices of micro-bolometer vents. The device is shown in FIG. 1.

It concerns a plaque of silicon (Si) 1 on which 0.3 μm of silicon dioxide 2, followed by 1 μm of amorphous Si 3 have been deposited. The oxide is etched in order to simulate the vent. The hole has a diameter of 3 μm and a depth of 0.3 μm.

The first cold vapour deposition of aluminium (Al) was carried out. The substrate was tilted 45° to the vapour stream to facilitate the clogging of the vent. A 2.6 μm deposit was obtained.

Figure 2:
FIG. 2 is a scanning electron microscope (SEM) view of the device after cold vapour deposition of aluminium (Al) in oblique incidence.

Observation under the scanning electron microscope shows that the aluminium layer failed to fill the vent (FIG. 2).

Figure 3:
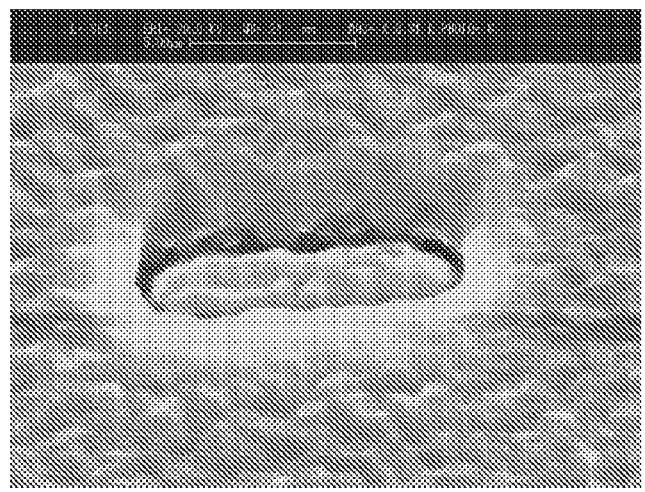
FIG. 3 is an SEM view of the device after hot evaporation deposition of Al in oblique incidence.

A new 3 μm thick deposit, produced by heating the sample and with the substrate-holder tilted at 45°, was carried out. The sample was heated to a temperature of 145° C. during the deposition. The conditions prevailing here are optimal, as defined by a person skilled in the art, for filling a vent with this type of method. The SEM analyses showed that the vent is nevertheless not plugged (FIG. 3).

Figure 4:
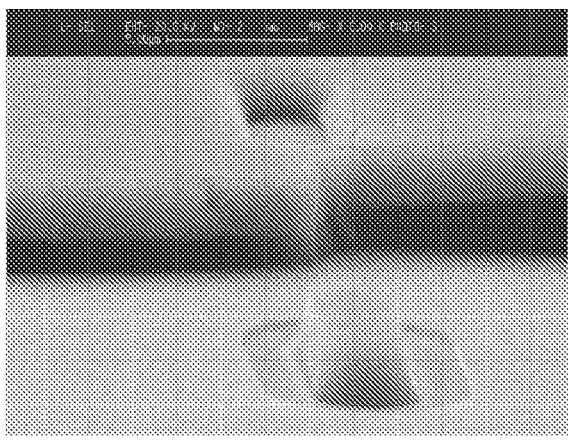
FIG. 4 is an SEM view of the device after deposition by evaporation of zinc sulphide (ZnS) in a BAK 760 type rack.

Another material, which has the advantage of being transparent in the infrared range, that is, zinc sulphide (ZnS), was tested. The deposition was made in a BALZERS BAK 760 type evaporator. The sample holder consisted of a shell. The SEM image shows that the vent was not plugged (FIG. 4).

Figure 5:
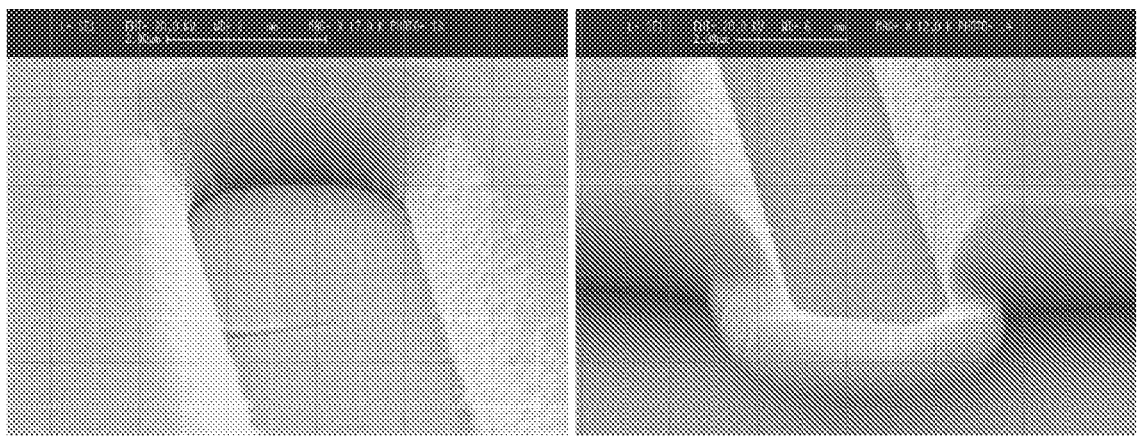
FIG. 5 is an SEM view of the device after deposition by evaporation of germanium (Ge).

FIG. 5 is a scanning electron microscope view of a section of the device already described after the deposition of germanium. The germanium was deposited under the conditions described above on a rack equivalent to the BALZERS BAK 760 model with a shell type substrate-holder.

The germanium thickness deposited here is 2 μm.

FIG. 5 shows that the deposit is satisfactory and that there is no discontinuity after the difference in level The hole in the device which simulates the vent of the micro-bolometer is plugged.

The invention claimed is:

1. A method for sealing a cavity of a component placed in a chamber by physical vapour deposition (PVD), wherein the deposition is carried out by evaporation of germanium or silicon, and wherein a layer deposition of said germanium or silicon covers a floor and sides of the cavity, wherein a sealed unfilled cavity is formed.

2. The method for sealing a cavity of a component according to claim 1, wherein the temperature in the chamber is lower than 100° C., advantageously about 20° C.

3. The method for sealing a cavity of a component according to claim 1, wherein the pressure in the chamber is between $10^{-5}$ Pa and $10^{-1}$ Pa.

4. The method for sealing a cavity of a component according to claim 3, wherein prior to evaporation, the pressure in the chamber is lower than $10^{-4}$ Pa.

5. The method for sealing a cavity of a component according to claim 3, wherein in the absence of degassing, the pressure in the chamber at the time of deposition is between $10^{-4}$ Pa and $10^{-3}$ Pa.

6. The method for sealing a cavity of a component according to claim 3, wherein in the presence of at least one gas, the pressure in the chamber at the time of deposition is about $10^{-1}$ Pa.

7. The method for sealing a cavity of a component according to claim 1, wherein the chamber consists of a standard evaporation PVD rack.

8. The method for sealing a cavity of a component according to claim 1, wherein the component is placed on a shell type sample-holder located in the chamber.

9. The method for sealing a cavity of a component according to claim 1, wherein the component is made from glass or polymer.

10. The method for sealing a cavity of a component according to claim 1, wherein the component consists of a nano- or micro-device.

11. The method for sealing a cavity of a component according to claim 10, wherein the component consists of a micro-bolometer.

12. A method for sealing an unfilled cavity of a component placed in a chamber by physical vapour deposition (PVD), wherein the deposition is carried out by evaporation of germanium or silicon, wherein a sealed cover is formed over the unfilled cavity, and wherein said sealed cover is transparent to infrared radiation.

13. The method for sealing a cavity of a component according to claim 1, wherein said sealed cavity contains an atmospheric pressure or vacuum.

* * * * *